United States Patent [19]

Itoh et al.

[11] Patent Number: 4,509,209

[45] Date of Patent: Apr. 2, 1985

[54] QUASI-OPTICAL POLARIZATION DUPLEXED BALANCED MIXER

[75] Inventors: Tatsuo Itoh; Karl D. Stephan, both of Austin, Tex.

[73] Assignee: Board of Regents, University of Texas System, Austin, Tex.

[21] Appl. No.: 477,968

[22] Filed: Mar. 23, 1983

[51] Int. Cl.[3] .................. H04B 1/26; H01Q 13/00
[52] U.S. Cl. .................. 455/327; 343/700 MS; 343/769; 455/330
[58] Field of Search ............ 455/270, 280, 281, 282, 455/293, 325, 326, 327, 328, 330, 331; 343/700 MS, 769

[56] References Cited

U.S. PATENT DOCUMENTS

| 2,142,159 | 1/1939 | Southworth et al. | 455/281 |
| 3,066,290 | 11/1962 | Whitehorn | 455/328 |
| 3,072,850 | 1/1963 | Whitehorn | 455/328 |
| 3,238,529 | 3/1966 | Bock | 455/281 |

FOREIGN PATENT DOCUMENTS

| 1933011 | 1/1971 | Fed. Rep. of Germany | 343/769 |
| 2751477 | 5/1979 | Fed. Rep. of Germany | 455/330 |

*Primary Examiner*—Marc E. Bookbinder
*Attorney, Agent, or Firm*—Arnold, White & Durkee

[57] ABSTRACT

An integrated planar antenna-mixer device for microwave reception utilizes a slot-ring antenna and a diode quad connected thereto. The device comprises a planar metallic sheet backed on one side by a dielectric layer. A circular ring pattern is cut from the metallic sheet forming a slot ring antenna with a central disc and a surrounding ground plane. Diodes of a diode quad are connected between the central disc and the ground plane with adjacent diodes being separated by 90°. The incoming microwave signal is directed perpendicular to the device plane and polarized in a direction orthogonal to a local oscillator signal similarly directed. Operation is quasi-optical without waveguides.

4 Claims, 11 Drawing Figures

QUASI-OPTICAL POLARIZATION DUPLEXED BALANCED MIXER

The present invention was made with Government support and the Government has rights in this invention pursuant to Dept. of Army Contract No. DAAG29-81-K-0053.

BACKGROUND OF THE INVENTION

The present invention relates to the conversion of a free-space microwave radiation signal to a lower frequency signal. More particularly, the present invention relates to a device for converting a microwave signal to an intermediate frequency signal for subsequent receiver processing by mixing the incoming microwave signal with a local oscillator signal.

In prior art microwave receiving apparatus, a radio frequency (RF) signal is received by an antenna. The signal produced by conversion of a plane wave signal is transmitted over a waveguide to a separate device for mixing the signal with a local oscillator signal to produce an intermediate frequency signal. In early microwave apparatus, horn-type antennas and waveguides were utilized. The resulting structure was physically large and bulky.

The problem of size in microwave reception apparatus has been overcome to some extent by the utilization in modern microwave reception apparatus of microstrip-type antennas and stripline or microstrip transmission lines. However, receivers built to intercept a free-space wave and convert it to a lower frequency signal continue to require separate, interconnected antenna and mixer structures. Also, the cost of the assembling of conventional antenna-waveguide-mixer apparatus is quite expensive.

SUMMARY OF THE INVENTION

The present invention provides an integrated planar antenna-mixer structure for use at millimeter-wave frequencies. The present invention obviates the problems of bulkiness associated with prior art microwave reception apparatus by combining the function of wave reception, transmission, and mixing (or detection) into a single structure. Additionally, assembly cost is minimized because automated fabrication and assembly methods may be utilized.

In accordance with the present invention, a microwave receiving antenna and a balanced mixer are combined in a planar structure. The antenna is a slot-ring antenna, and the balanced mixer is a doubly-balanced mixer including four non-linear elements. Preferably, the mixer is a diode quad.

The device structure is fabricated in one metallized pattern on a dielectric substrate. For example, a planar sheet of dielectric material is coated with metal on one side, and a circular ring pattern is cut from the metal sheet to form a slot-ring antenna. Diodes are placed at various points across the gap. Also, if desired, the dielectric substrate can be the semiconductor in which the mixer diodes are formed.

In operation, a local oscillator signal is directed perpendicular to the device plane. The incoming microwave signal is introduced in a similar manner and is polarized in a direction orthogonal to the local oscillator signal. The intermediate frequency signal appears between the central metal disc and the surrounding metal sheet.

The device of the present invention finds use in applications requiring imaging of a microwave field. In particular, the device may advantageously be utilized in an array of closely-spaced receivers. Furthermore, the device of the present invention provides for quasi-optical operation in that no waveguide is used for feeding the radio frequency (RF) and local oscillator (LO) signal to the device.

BRIEF DESCRIPTION OF THE DRAWINGS

A written description setting forth the best mode presently known for carrying out the present invention, and of the manner of implementing and using it, is provided by the following detailed description of a preferred embodiment which is illustrated in the attached drawings wherein.

DETAILED DESCRIPTION OF ILLUSTRATIVE EMBODIMENT

Figure 1:
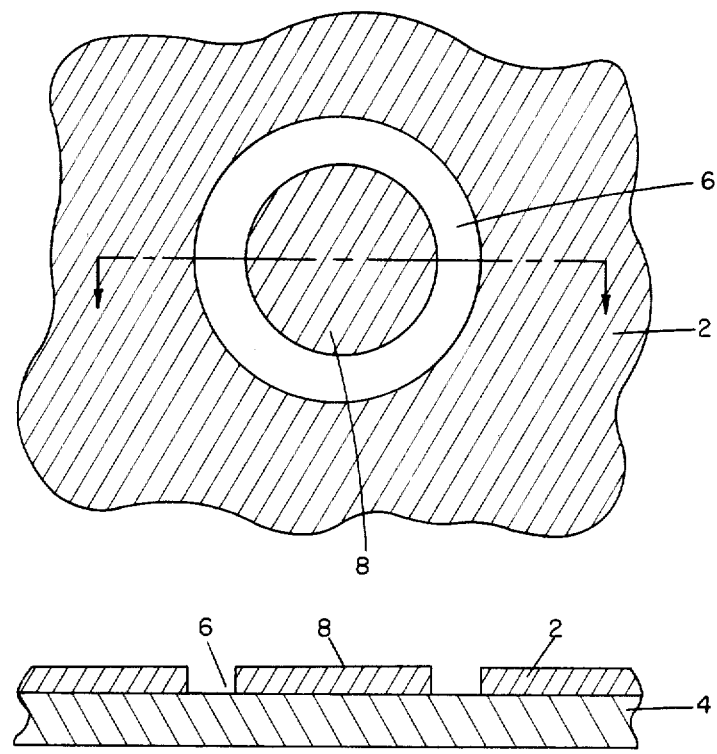
FIG. 1 is a schematic diagram of a basic slot-ring antenna structure.

The device described herein and shown in the drawing figures combines the functions of receiving antenna and balanced mixer. The device comprises a slot-ring antenna and a diode quad mixer.

A. Slot Ring Antenna

The slot-ring antenna is one of a class of radiating structures formed from a gap or hole in an otherwise continuous metallic sheet. The sheet may or may not be backed on one side by a dielectric layer, but preferably it is. The slot-ring antenna structure is shown in FIG. 1, wherein a continuous metallic sheet 2 has a dielectric backing 4. A circular slot 6 is formed in sheet 2, which defines a disc portion 8.

Figure 2:
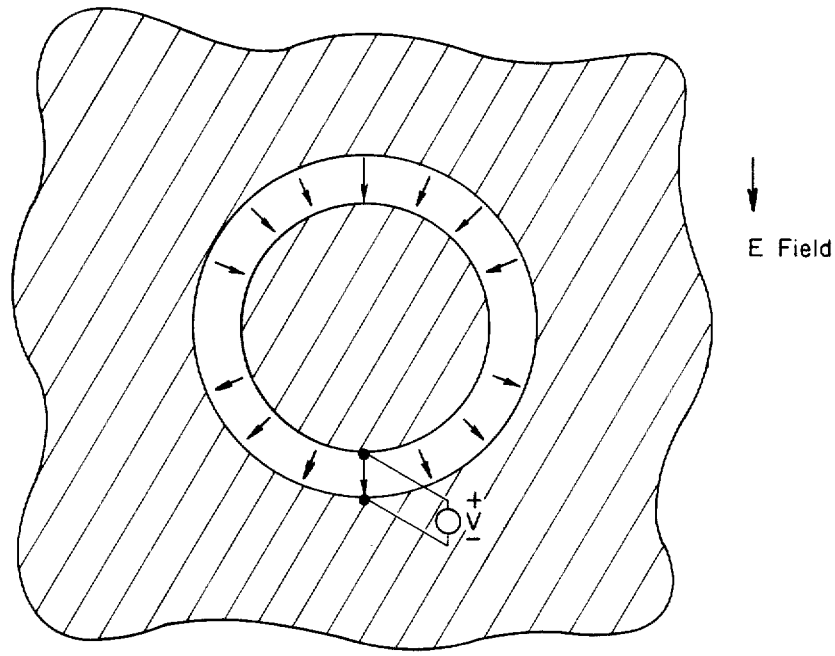
FIG. 2 is a schematic diagram of a slot-ring antenna feed method showing an electric field in the plane of the device.

The slot-ring antenna structure has resonant modes that occur at frequencies for which the ring circumference equals an integral number of signal wavelengths. To use the structure as an antenna, the first-order mode is excited as shown in FIG. 2. Neglecting the other modes for discussion purposes, the impedance seen by the voltage source will be real at resonance, and all the power delivered will be radiated.

Figure 3A:
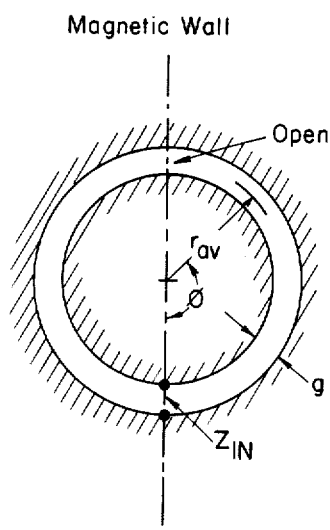
FIGS. 3(a) and 3(b) are diagrams illustrating a transmission line equivalent circuit of the slot-ring antenna.
Figure 3B:
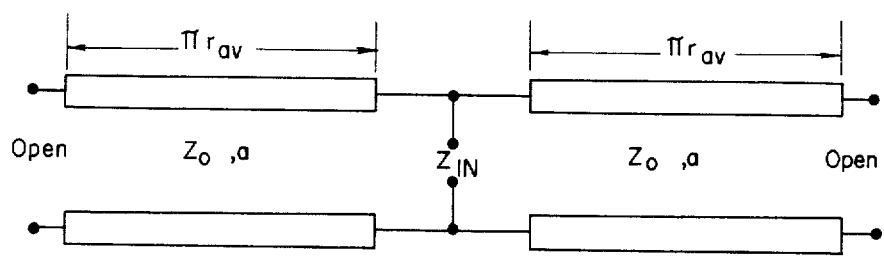

A first-order estimate of the resonant frequency can be derived from the transmission line equivalent circuit of the slot-ring. By placing a magnetic wall across the ring as shown in FIG. 3(a), nothing is disturbed since the structure is symmetrical. The wall permits opening the ring at the point diametrically opposite the feed, since no current flows through the wall. This operation yields the equivalent transmission-line circuit shown in FIG. 3(b).

At the resonant frequency of the first-order mode, the two lines are each a half-wave long electrically. Knowledge of the mechanical length ($\pi r_{av}$, where $r_{av}$ is the average ring radius) and the velocity factor allows the calculation of resonance to within about 10%-15% of the true frequency. The smaller the relative gap $g/r_{av}$, the better the estimate will be. For a more precise calculation, refer to spectral-domain techniques as taught in K. Araki and T. Itoh, "Hankel Transform Domain Analysis of Open Circular Microstrip Radiating Structures", IEEE Trans. Antennas and Propogation, Vol. AP-29, pp. 84-89, January 1981. Once the resonant frequency is determined for a particular application, both the radiation patterns and the impedance may be found by means of the following analysis.

In the article by Araki and Itoh, it is shown that if the tangential electric field on a cylindrically symmetric planar surface is known, the field can be Hankel-transformed to derive the far-field radiation patterns from that surface. As described by them, the fields must be calculated from estimates of the currents on a microstrip patch. In the present invention, however, a very simple estimate of the electric field in the slot will yield a good evaluation of the antenna patterns and the radiation impedance.

In choosing an estimate of the field, a functional form should be chosen that is easy to Hankel-transform analytically. The estimate chosen is this:

$$E_r(r) = \frac{1}{r} \text{ for } \left(r_{av} - \frac{g}{2}\right) < r < \left(r_{av} + \frac{g}{2}\right) \tag{1}$$

$$E_r(r) = 0 \tag{2}$$

$$E_\phi = 0 \tag{3}$$

This simple choice satisfies the boundary condition that the tangential electric field be zero on the metallic sheet, and expresses the proposition that, for narrow gaps, the azimuthal filed in the gap will be small compared to the radial filed.

The $(n \pm 1)$th order Hankel transform of the chosen function is defined to be:

$$\tilde{E}_{(\pm)}(\alpha) = \int_0^\infty E_r(r) J_{n \pm 1}(\alpha r) \, r \, dr \tag{4}$$

where $J_n(\alpha r)$ is the $n^{th}$ order Bessel function of the first kind, and $\alpha$ is the Hankel transform variable. Applying this to the chosen estimate, we find $$\tilde{E}_{(\pm)}(\alpha) = \int_{r_i}^{r_a} \frac{1}{r} J_{n \pm 1}(\alpha r) \, r \, dr \tag{5}$$

$$\tilde{E}_{(\pm)}(\alpha) = \int_{r_i}^{r_a} J_{n \pm 1}(\alpha r) \, dr \tag{6}$$

where the inner and outer ring radii are $r_i$ and $r_a$, respectively. This integral is easy to evaluate analytically, through recursion relations given in published tables such as those in M. Abramowitz and I. Stegun, Handbook of Mathematical Functions, Washington, D.C., U.S. Government Printing Office, 1972. Assuming that all the fields vary as $e^{jn\phi}$, and using the saddle-point equations given by K. Araki and T. Itoh, "Hankel Transform Domain Analysis of Open Circular Microstrip Radiating Structures", IEEE Trans. Antennas and Propogation Vol. AP-29, pp. 84-89, January 1981, it is found that the farfield equations for $E_\theta$ and $E_\phi$ are $$E_\theta(r,\theta,\phi) = -k_o \frac{e^{-jk_o r}}{r} \frac{j^n e^{jn\phi}}{2} [\tilde{E}_o(k_o \sin\theta)] \tag{7}$$

$$E_\phi(r,\theta,\phi) = +k_o \frac{e^{-jk_o r}}{r} \frac{j^{n+1} e^{jn\phi}}{2} \cos\theta [\tilde{E}_e(k_o \sin\theta)] \tag{8}$$

where linear combinations of the Hankel-transformed estimates are used:

$$\tilde{E}_e(k_o \sin\theta) = \tilde{E}_{(+)}(k_o \sin\theta) + \tilde{E}_{(-)}(k_o \sin\theta). \tag{9}$$

$$\tilde{E}_o(k_o \sin\theta) = \tilde{E}_{(+)}(k_o \sin\theta) - \tilde{E}_{(-)}(k_o \sin\theta) \tag{10}$$

The standard spherical coordinates r, $\theta$, and $\phi$ refer to the point at which the fields are measured, $r=0$ being the center of the ring. The quantity $k_o$ is the wavenumber in free space, $$\omega \sqrt{\mu_o \epsilon_o},$$

and n is the order of resonance being analysed. In the case of interest, $n=1$ and $\omega = \omega_o$, the resonant frequency.

Equations (7) through (10) apply to any tangential electric field in the plane containing the origin of the spherical coordinate system. In order to treat the case of a finite thickness of dielectric, the estimated field must be transformed through the dielectric layer so that the Hankel transforms operate on the dielectric-air interface. In the Hankel transform domain, tis is a relatively easy process. Define d to be the thickness of the dielectric layer of relative dielectric constant $\epsilon_r$. If we let $$a = k_o \sin\theta \tag{11}$$

$$\beta_1 = \sqrt{k_o^2 - \alpha^2} \tag{12}$$

$$\beta_2 = \sqrt{k_o^2 \epsilon_r - \alpha^2} \tag{13}$$

$$f_e(\alpha) = \frac{\beta_2 \cos\beta_2 d + j \epsilon_r \beta_1 \sin\beta_2 d}{\beta_2 \sin\beta_2 d - j \epsilon_r \beta_1 \cos\beta_2 d} \tag{14}$$

$$f_h(\alpha) = \frac{\beta_2 \sin\beta_2 d - j \beta_1 \cos\beta_2 d}{\beta_2 \cos\beta_2 d + j \beta_1 \sin\beta_2 d} \tag{15}$$

then the Hankel transformed fields at the dielectric-air interface are given by $$\tilde{E}_e(\alpha) = [\cos\beta_2 d + f_h(\alpha) \cdot \sin\beta_2 d] \cdot [\tilde{E}_{(+)}(\alpha) + \tilde{E}_{(-)}(\alpha)] \tag{16}$$

$$\tilde{E}_o(\alpha) = [\cos\beta_2 d - f_e(\alpha) \cdot \sin\beta_2 d][\tilde{E}_{(+)}(\alpha) - \tilde{E}_{(-)}(\alpha)] \tag{17}$$

Substituting these equations into (7) and (8) now gives the far-field expressions for the dielectric-coated side of the slot ring antenna.

It should be noted that this analysis assumes that only the first-order mode is excited, and that no higher-order surface waves arise. The former assumption is justified in that the zero-order mode and all higher-order modes have a very small radiation impendance compared to that of the first-order mode, at its resonant frequency. The latter assumption may be justified, as taught in R. F. Harrington. *Time-Harmonic Electromagnetic Fields*, New York, McGraw-Hill, 1961, p. 169, when the dielectric thickness is less than $$d_{max} = \frac{\pi}{2k_o \sqrt{\epsilon_r - 1}} \quad (18)$$

Also, the equations assume that the metallic sheet extends to infinity. Practical antennas always stop short of this, but the effects of a non-infinite conductor will appear as inaccuracies only near $\theta = 90°$.

The third aspect to be addressed is the radiation impedance. A classic method easily yields this result. The terminal voltage can be found by integrating the assumed field across the gap:

$$|V| = \int_{r_i}^{r_a} \frac{1}{r} dr \quad (19)$$

$$|V| = \ln\left(\frac{r_a}{r_i}\right) \quad (20)$$

The total power radiated from the antenna with this voltage at its terminals is obtained, as taught by J. Kraus, *Antennas*, New York, McGraw-Hill, 1950, p. 28, using equations (7) and (8):

$$P = \iint_{sphere} \frac{\frac{1}{2}(|E_\theta|^2 + |E_\phi|^2)}{Z_{fs}} ds \quad (21)$$

where $Z_{fs}$ is the intrinsic impedance of free space.

Since the input impedance $Z_{in}$ at resonance is purely resistive, the input power at the terminals equals the radiated power:

$$2 \cdot \frac{V^2}{2Z_{in}} = P \quad (22)$$

The factor of 2 in front arises from the fact that the practical antenna is excited from only one point, but the field equations assume excitation of both orthogonal modes in quadrature ($\cos \theta + j \sin \theta$). Solving for $Z_{in}$, we find $$Z_{in} = \frac{\ln\left(\frac{r_a}{r_i}\right)^2}{P} \quad (23)$$

The proper equations must be used for $E_\theta$ and $E_\phi$ on the dielectric and metal sides. This completes the analysis of the antenna. Strictly speaking, the resistance found in equation (23) applies only at the resonant frequency, although it will not vary appreciably for a small frequency range around resonance. The slot-ring antenna operated at its first-order resonance is a fairly low-Q device, so neither precise impedance calculations nor exact resonant frequencies are vital to a serviceable design.

B. Diode Quad Mixer

The slot-ring antenna can support two independent first-order modes. This allows a form of polarization duplexing in which two feed points, if separated by 90° along the ring, can couple independently to horizontally and vertically polarized waves, with little or no cross-coupling between the feeds. For exact independence, the two orthogonal feeds should each be balanced on diametrically opposite sides of the ring to provide four feed points but the slight imbalance caused by using only two feed points is small.

Figure 4:
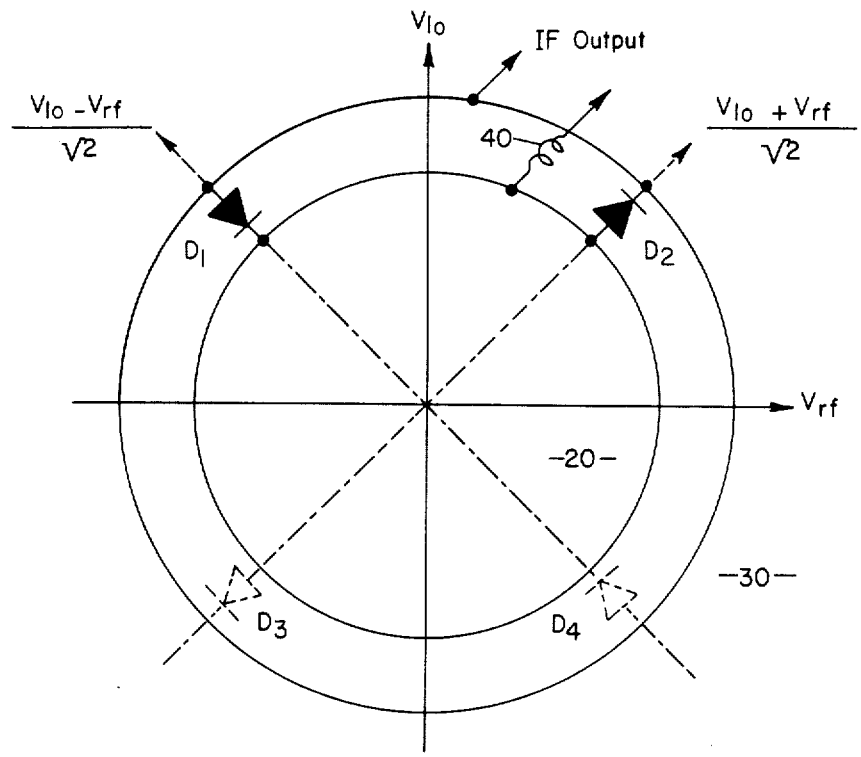
FIG. 4 is a diagram of an antenna-mixer device in present invention.

The mixing operation of the device of the present invention in a balanced, polarization-duplexed mode is illustrated in FIG. 4. The RF signal arrives as a horizontally polarized plane wave incident perpendicular to the antenna on the dielectric side. The local oscillator LO signal is vertically polarized, and can arrive from either side of the structure. $V_{rf}$ and $V_{lo}$ show the electric field vectors on the antenna plane. By resolving each vector into two perpendicular components, it is easy to see that mixer diode $D_1$ receives $$\frac{V_{lo} - V_{rf}}{\sqrt{2}},$$

while $D_2$ receives $$\frac{V_{lo} + V_{rf}}{\sqrt{2}}.$$

In effect, each diode has its own independent mixer circuit, with the IF outputs added in parallel. The intermediate frequency IF signal appears as a voltage between the central metal disc 20 and the surrounding ground plane 30, and is removed through an RF choke 40. A double-balanced mixer with improved isolation can be made by adding two additional diodes $D_3$ and $D_4$, as indicated.

The diodes can be treated independently because each diametrically opposite diode pair is at the zero-voltage node of the field patterns of the other diode pair. To evaluate the impedance seen by a single diode, consideration is given to the nature of the impedance $Z_{in}$ in FIG. 3(b). At the resonant frequency of the slot-ring antenna, the diode will see the antenna's radiation resistance, typically about 250 ohms. This impedance level is compatible with available diodes. At frequencies removed from resonance, the impedance presented to the diode will include reactance, but this variation is well-modelled by the transmission-line equivalent circuit up to the frequency at which the slot is no longer small compared to a wavelength. For narrow slots, this can be 10 to 20 times the operating frequency. Mixer performance is, of course, very dependent on the diode embedding impedance at RF and LO harmonic frequencies and combinations thereof. As the order of resonance increases, the slot ring becomes an increasingly poor radiating structure, so little power will be radiated in the form of higher harmonics.

Figure 5:
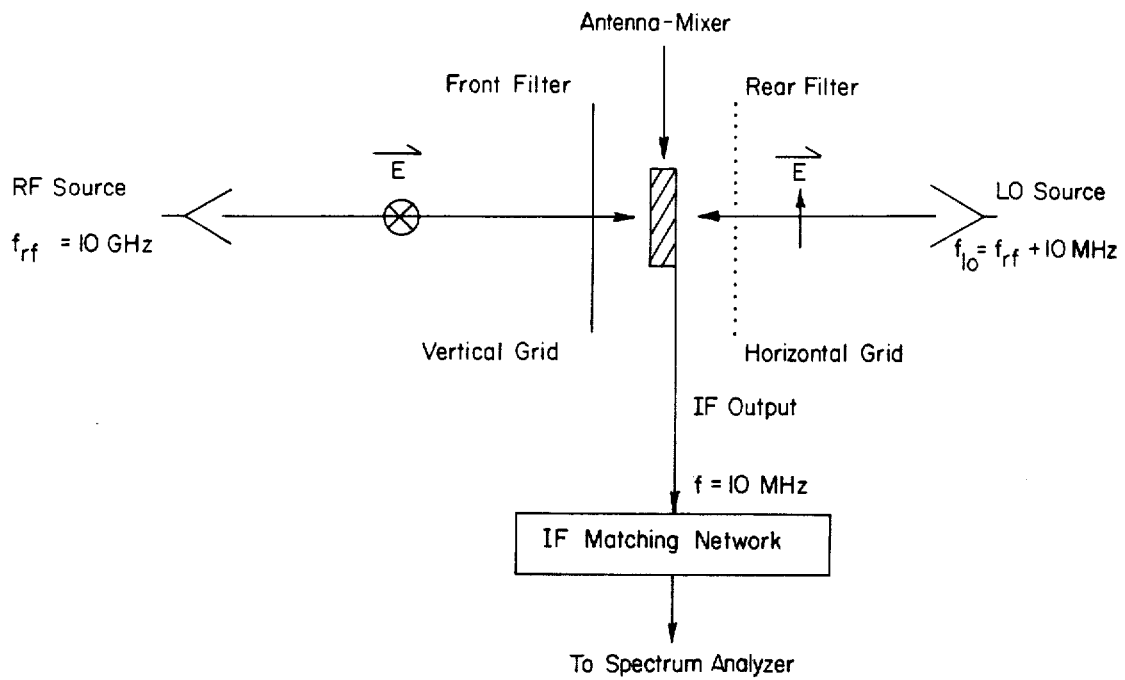
FIG. 5 shows a quasi-optical test set-up used in testing devices in accordance with the present invention.

The antenna-mixer device of the present invention can be introduced in a quasi-optical arrangement in the form described herein with good LO-to-RF isolation, because of the symmetry afforded by the balanced configuration. Additional improvement is easily achieved by introducing grid-type polarization filters on either side, as shown in FIG. 5. Horizontally polarized RF energy entering from the left passes through the front filter with little attenuation, and is received by the antenna. The rear filter is oriented to reflect the horizontally polarized RF wave, increasing directivity in the forward direction. Vertically polarized LO energy not absorbed by the antenna is blocked by the front filter and reflected back to the antenna, allowing a high degree of LO-RF isolation.

C. Operational Characteristics

Summarized in Table I below is data on impedance measurements of slot-ring antenna structures. The calculated resonant frequencies were found using extrapolations of the published tables of Mariani et al., "Slot Line Characteristics," *IEEE Trans. Microwave Theory Tech.*, Vol. MTT-17, pp. 1091–1096, December 1969, for the $\epsilon_r=12$ cases. For the $\epsilon_r=1$ cases, the average circumference was equated to the free-space signal wavelength for a first-order estimate, which turned out to be some 11% low. The radiation resistances were calculated using the experimentally derived resonant frequencies. Very good agreement was obtained for the $\epsilon_r=1$ cases, and the 12% error for the $\epsilon_r=12$ case is partly due to the poor mechanical contact between the metal foil used as the conducting sheet and the ceramic dielectric slab. Note that the radiation Q rises for the higher dielectric, but is still tolerably low even for a substrate having a dielectric constant near that of GaAs.

TABLE 1
SLOT RING IMPEDANCE MEASUREMENTS

|  |  | A | B | C |
|---|---|---|---|---|
| Structure Dimensions | Inner Radius (cm.) | 7.7 | 7.7 | 3.048 |
|  | Outer Radius (cm.) | 8.2 | 7.95 | 3.302 |
|  | Dielectric Constant (Relative) | 1 | 1 | 12 |
|  | Layer Thickness (cm.) | — | — | 0.635 |
| Calculated Values | Resonant Frequency (MHz) | 600 | 610 | 720 |
|  | Radiation Resistance (ohms) | 240* | 244* | 590** |
| Measured Values | Resonant Frequency (MHz) | 675 ± 2 | 676 ± 2 | 882 ± 2 |
|  | Radiation Resistance (ohms) | 275 ± 10 | 232 ± 10 | 518 ± 20 |
|  | Radiation Q | 5 | 6.6 | 25.9 |

*At $f_o = 660$ MHz
**At $f_o = 880$ MHz

Figure 6:
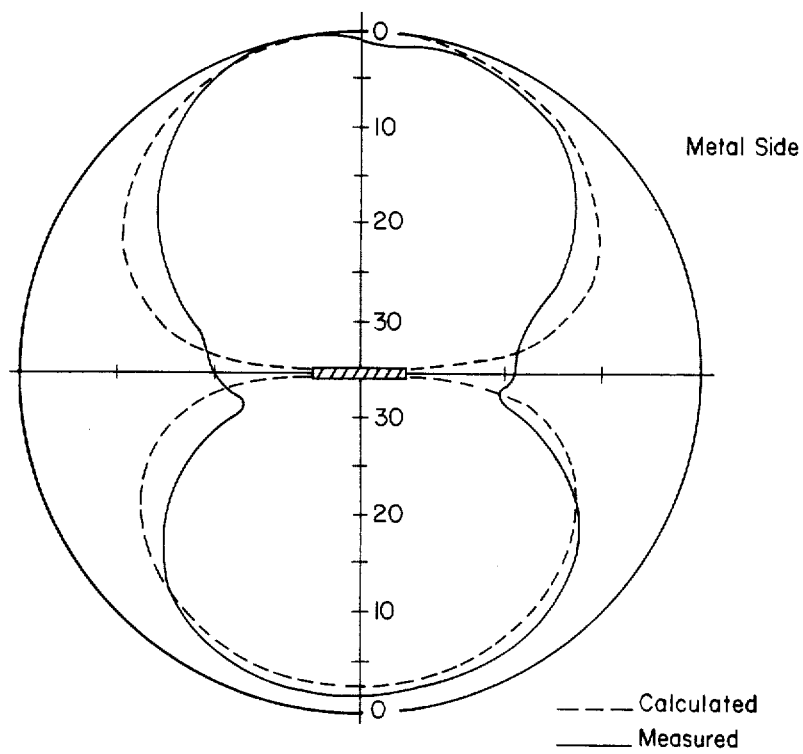
FIG. 6 shows calculated and measured H-plane patterns for a 10 GHz slot-ring antenna.
Figure 7:
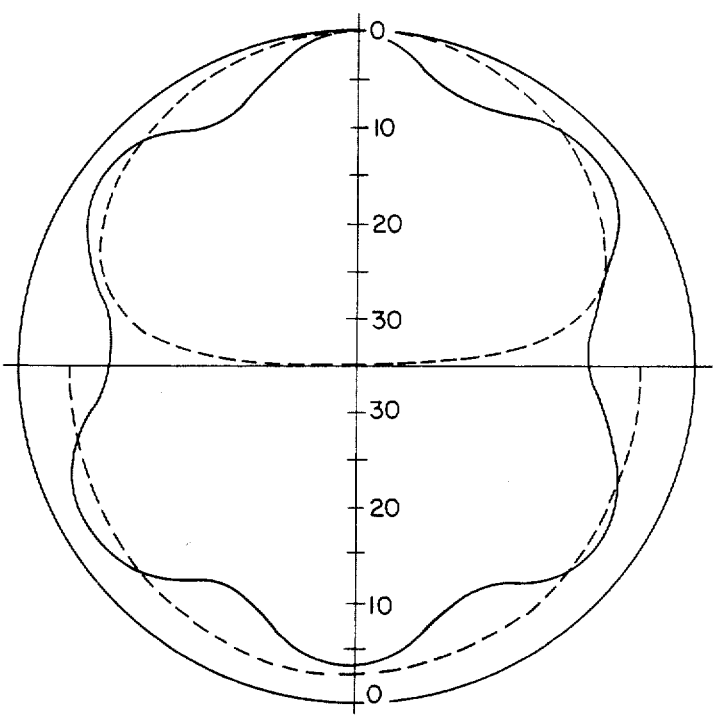
FIG. 7 shows calculated and measured E-plane patterns in the 10 GHz slot-ring antenna.

Calculated and measured antenna patterns are shown in FIGS. 6 and 7 for a 10 GHz model. The plots are all scaled in decibels down from maximum radiation intensity. As anticipated, the predicted H-plane nulls in the plane of the device are partially filled in by attenuated surface waves. Overall agreement is good, especially the ratio of peak radiation intensity on the dielectric side to the metal side. An increase in either the resonant frequency or the dielectric constant will tend to pull the excitation currents to the dielectric side, increasing the field intensity there.

Using the measured antenna patterns for the 10 GHz model, an approximate directivity on the dielectric side was calculated to be 4.5 dB, which is typical of the rather broad patterns measured. The same antenna used with a balanced mixer in the manner shown in FIG. 4 with its LO excitation was placed in an RF field of known intensity, and the directivity figure found above was used to calculate the actual RF power available to the mixer input, since direct measurement was impractical. The ratio of available RF input power to the measured IF output power delivered to a LO-MHz matching network gave the conversion loss reported in Table 2 below. The 6.5±3 dB figure compares favorably to conventional mixer configuration. Depending on the effective diode impedance, this could be improved further with impedance-matching circuitry or different ring dimensions.

TABLE 2
MEASURED ANTENNA-MIXER CHARACTERISTICS

| Dimensions: |
|---|
| Inner ring radius: 0.39 cm. |
| Outer ring radius: 0.54 cm. |
| Dielectric: 0.3175 cm. thick, $\epsilon_r = 2.23$ |
| Diodes used: |
| NEC ND4131 ($R_s = 12$ ohms) |
| Antenna-mixer system: |
| RF frequency: 10 GHz |
| IF frequency: 10 MHz |
| RF polarization: Horizontal |
| LO polarization: Vertical |
| Measured conversion loss: 6.5 dB ± 3 dB |
| LO-RF isolation: ≧ 30 dB |
| RF Cross-polarization rejection: 20 dB |

Owing to lack of a suitable local oscillator source, actual mixer data is not yet available in the millimeter-wave range, but extensive antenna patterns were measured with a single detector diode (HP 50822264) mounted on the ring feed point. Two different substrates were used. One was 0.3 mm-thick alumina, which was coated with a layer of gold about 2000 Å thick. Gold wire rings were used as masks to block the evaporation, forming the slot rings. The other substrate was a polymer compound with precoated copper on one side, removed mechanically to make rings. The antennas evaluated are specified in Table 3.

TABLE 3
MILLIMETER-WAVE ANTENNA DIMENSIONS

|  | Alumina Substrate | Plastic Substrate |
|---|---|---|
| Dielectric Constant | 9.6 | 2.23 |
| Inner Ring Radius | 0.0325 cm. | 0.045 cm. |
| Outer Ring Radius | 0.0375 cm. | 0.070 cm. |
| Substrate Thickness | 0.03 cm. | 0.1588 cm. |
| Calculated Radiation Resistance | 413 Ω at 65.2 GHz | 390 Ω at 65.2 GHz |
| Substrate Size | 2.9 cm. high 1.9 cm. wide | 5 cm. square |

Figure 8:
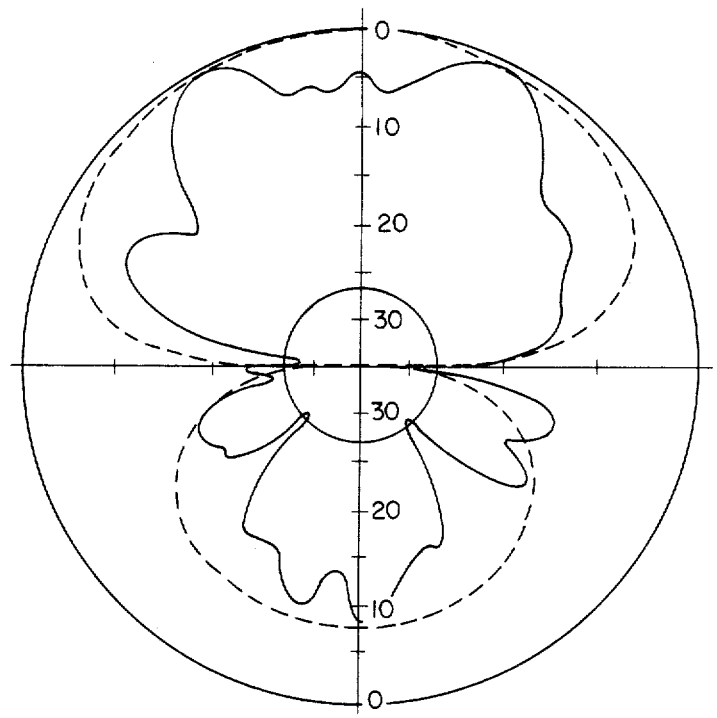
FIG. 8 shows calculated and measured H-plane patterns at 65.2 GHz with a device having an alumina substrate.
Figure 9:
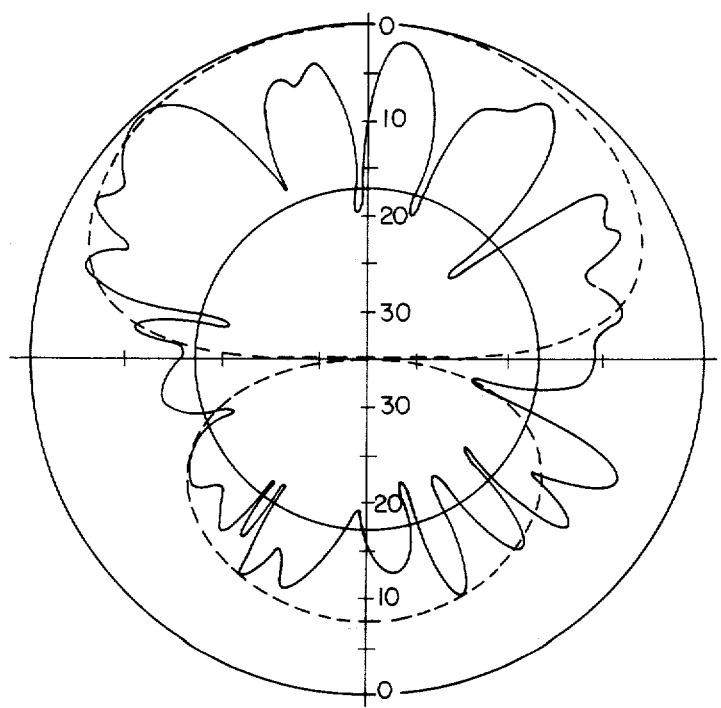
FIG. 9 shows calculated and measured H-plane patterns at 95.5 GHz with a device having an alumina substrate.

The alumina substrate was thin enough to avoid higher-order surface waves at 65.2 GHz, its approximate design frequency. Calculated and measured patterns at this frequency are shown in FIG. 8. Although the first-order mode radiation pattern does not predict the fine structure seen, prominent features such as the nulls in the plane of the device and the peak field values are predicted quite accurately. Compare this pattern to the one in FIG. 9, taken at 95.5 GHz. Higher-order modes are evidently excited and surface wave have filled in the side nulls.

The plastic-substrate antenna was designed for 30 GHz, but equipment difficulties prevented pattern measurements in that range. The measurements of the same antenna at 65.2 GHz (FIG. 10) show effects of surface-wave excitation. The period of the nulls on the dielectric side is consistent with diffraction from the edges of the substrate itself, where surface waves emerge into the air.

Figure 10:
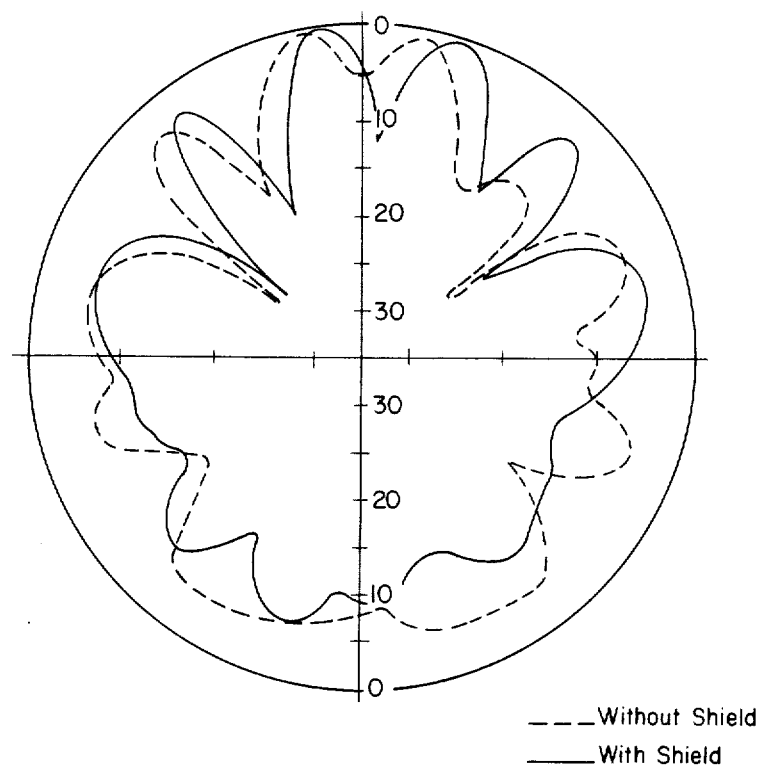
FIG. 10 shows measured patterns at 65.2 GHz with a device having a plastic substrate, and with a feed shield (solid line) and without a feed shield (dashed line).

FIG. 10 also shows that the feed method used does not interfere significantly with the radiation patterns. In all other tests, the detected signal was removed from the central patch through a thin wire connected perpendicular to the device plane. After leading away from the antenna for 1-2 cm, the feed wire bends parallel to the substrate and leads to the output connector. The solid curve in FIG. 10 shows the effect of placing the insulated feed wire on the substrate and covering it with copper foil. The pattern change is relatively small, indicating that the original non-shielded feed was satisfactory. If the thin wire is not convenient mechanically, one alternative would be a coplanar line at IF, intersecting the central disc in the manner of a stick on a lollipop. A low-pass filter could be made of various sections of line with different impedances.

The slot-ring antenna-diode mixer device of the present invention is a simple, practical component for use in quasi-optical receiving systems. A simple, but accurate, theory allows calculation of the radiation pattern and feed-point impedance, including effects of the dielectric layer. The performance of an X-band model was quite good and millimeter-wave measurements of structures on a high-dielectric-constant substrate indicate the practicality of forming such a device directly on a thin GaAs wafer. Arrays of such devices could provide phase-coherent imaging of millimeter-wave fields at a focal plane. In addition to permitting image formation, arrays of devices will increase the overall system efficiency by presenting a larger effective aperture to typically large quasi-optical beams.

The foregoing description of the invention has been directed to particular preferred embodiments for purposes of explanation and illustration. It will be apparent, however, those skilled in this art that many modifications and changes in the structure described may be made without departing from the essence of the invention. For example, the entire structure of the antenna-mixer device could be built on the flat surface of semiconductor crystal. Further, the received radial frequency signal waves and the local oscillator signal waves can be directed to the same side of the device or on either side of the device. Further, in removing the intermediate frequency signal, a small microstrip or coplanar line pattern could be utilized. With regard to fabrication, for monolithic realization of the device, the diodes could be created directly in a semiconductor substrate such as gallium arsenide with a slot-ring pattern being formed by a technique such as evaporation deposition, so that diodes are created in-situ and are placed at appropriate locations along the ring. These, and other modifications of the apparatus described, will be apparent to those skilled in this art. It is the applicants intention of the following claims to cover all such equivalent modifications and variations as fall within the scope of the invention.

What is claimed is:

1. Apparatus for converting a free-space radio frequency signal into an intermediate frequency signal using a local oscillator signal, comprising:
   - a slot-ring antenna for receiving a quasi-optical free-space radio frequency signal and a local oscillator signal, the radio frequency signal being polarized in a direction orthogonal to the local oscillator signal; and
   - a pair of diodes connected to the slot ring antenna, for mixing the received radio frequency and local oscillator signals.

2. The apparatus of claim 1 further comprising:
   - a second pair of diodes connected to the slot-ring antenna forming a diode quad, for mixing the received radio frequency and local oscillator signals.

3. Apparatus for converting a free-space radio frequency signal into an intermediate frequency signal using a local oscillator signal, comprising:
   - a slot-ring antenna including a metallized ring pattern on a dielectric substrate, for receiving a free-space radio frequency signal and a local oscillator signal, the radio frequency signal being polarized in a direction orthogonal to the local oscillator signal; and
   - a diode quad connected to the metallized pattern of the slot-ring antenna with the diodes being disposed along the ring so that adjacent diodes are separated by 90°, for mixing the received radio frequency and local oscillator signals to produce an intermediate frequency signal.

4. Apparatus for converting a free-space radio frequency signal into an intermediate frequency signal using a local oscillator signal, comprising:
   - a slot-ring antenna including a metallic sheet having a dielectric layer backing and a ring slot formed therein defining a central disc portion and a ground plane portion for receiving a free-space radio frequency signal and a local oscillator signal, the radio frequency signal being polarized in a direction orthogonal to the local oscillator signal; and
   - a diode quad, each diode being connected between the disc portion and the ground plane portion of the antenna with adjacent diodes being separated by 90°;
   - said diode quad mixing the received radio frequency and local oscillator signals to produce an intermediate frequency signal available as a voltage between the central disc and the surrounding ground plane.

* * * * *

UNITED STATES PATENT AND TRADEMARK OFFICE
CERTIFICATE OF CORRECTION

PATENT NO. : 4,509,209  Page 1 of 2
DATED : April 2, 1985
INVENTOR(S) : Tatsuo Itoh and Karl D. Stephan It is certified that error appears in the above-identified patent and that said Letters Patent is hereby corrected as shown below:

Column 4, line 41, delete "d" and insert --$\underline{d}$--.

Column 5, lines 53 to 56 (equation 23), delete $$Z_{in} = \frac{\ln\left(\frac{r_a}{r_i}\right)^2}{P}$$

and insert therefor $$Z_{in} = \frac{\ln\left[\left(\frac{r_a}{r_i}\right)\right]^2}{P}$$

UNITED STATES PATENT AND TRADEMARK OFFICE
CERTIFICATE OF CORRECTION

PATENT NO. : 4,509,209  Page 2 of 2
DATED : April 2, 1985
INVENTOR(S) : Tatsuo Itoh and Karl D. Stephan It is certified that error appears in the above-identified patent and that said Letters Patent is hereby corrected as shown below:

Column 5, line 58, delete "$E_{74}$" and insert --$E_\theta$--.

Column 3, line 45, delete "filed and insert --field--.

Column 3, line 46, delete "filed" and insert --field--.

Column 4, line 40, delete "tis" and insert --this--.

Column 5, line 3, delete "impendance" and insert --impedance--.

Column 6, line 44, delete "impendance" and insert --impedance--.

Column 9, line 35, delete "however, those" and insert --however, to those--.

Signed and Sealed this

Thirty-first Day of December 1985

[SEAL]

Attest:

DONALD J. QUIGG

Attesting Officer

Commissioner of Patents and Trademarks